(12) United States Patent
Cho

(10) Patent No.: US 9,553,267 B2
(45) Date of Patent: Jan. 24, 2017

(54) METHOD OF MANUFACTURING ORGANIC LIGHT-EMITTING DEVICE

(71) Applicant: Samsung Electronics Co., Ltd., Suwon-si, Gyeonggi-do (KR)

(72) Inventor: Sunghwan Cho, Hwaseong-si (KR)

(73) Assignee: SAMSUNG ELECTRONICS CO., LTD, Gyeonggi-do (KR)

( * ) Notice: Subject to any disclaimer, the term of this patent is extended or adjusted under 35 U.S.C. 154(b) by 0 days.

(21) Appl. No.: 14/879,559

(22) Filed: Oct. 9, 2015

(65) Prior Publication Data

US 2016/0315261 A1    Oct. 27, 2016

(30) Foreign Application Priority Data

Apr. 27, 2015    (KR) .................. 10-2015-0059105

(51) Int. Cl.
| | |
|---|---|
| *H01L 21/00* | (2006.01) |
| *H01L 51/00* | (2006.01) |
| *H01L 51/56* | (2006.01) |
| *H01L 27/32* | (2006.01) |
| *H01L 51/50* | (2006.01) |

(52) U.S. Cl.
CPC ....... *H01L 51/0006* (2013.01); *H01L 27/3211* (2013.01); *H01L 27/3248* (2013.01); *H01L 51/56* (2013.01); *H01L 51/5012* (2013.01)

(58) Field of Classification Search
CPC .. H01L 51/0006; H01L 51/56; H01L 27/3248; H01L 27/3211
USPC .......................................................... 438/46
See application file for complete search history.

(56) References Cited

U.S. PATENT DOCUMENTS

| | | | |
|---|---|---|---|
| 8,623,696 B2 | 1/2014 | Cho et al. | |
| 2007/0077349 A1 | 4/2007 | Newman et al. | |
| 2010/0155496 A1 | 6/2010 | Stark et al. | |

FOREIGN PATENT DOCUMENTS

| | | |
|---|---|---|
| JP | 2007305507 A | 11/2007 |
| JP | 2011173085 A | 9/2011 |
| KR | 1020080065769 A | 7/2008 |
| KR | 1020140036414 A | 3/2014 |

OTHER PUBLICATIONS

Ju, et al., Thin-Film Fabrication Method for Organic Light-Emitting Diodes Using Electrospray Deposition, Advanced Materials, 2009, vol. 21, pp. 4343-4347.

*Primary Examiner* — Anthony Ho
(74) *Attorney, Agent, or Firm* — Cantor Colburn LLP

(57) ABSTRACT

A method of manufacturing an organic light-emitting device including a plurality of pixels using an organic solution spray apparatus, where each of the pixels comprises a plurality of sub-pixels having different colors, includes: preparing a substrate on which a plurality of sub-pixel regions is defined; generating a potential difference between a nozzle of the organic solution spray apparatus and the sub-pixel regions; spraying an organic solution from the nozzle of the organic solution spray apparatus to the sub-pixel regions; and forming an organic material layer by selectively depositing the organic solution to the sub-pixel regions using the potential difference between the nozzle and the sub-pixel regions.

19 Claims, 16 Drawing Sheets

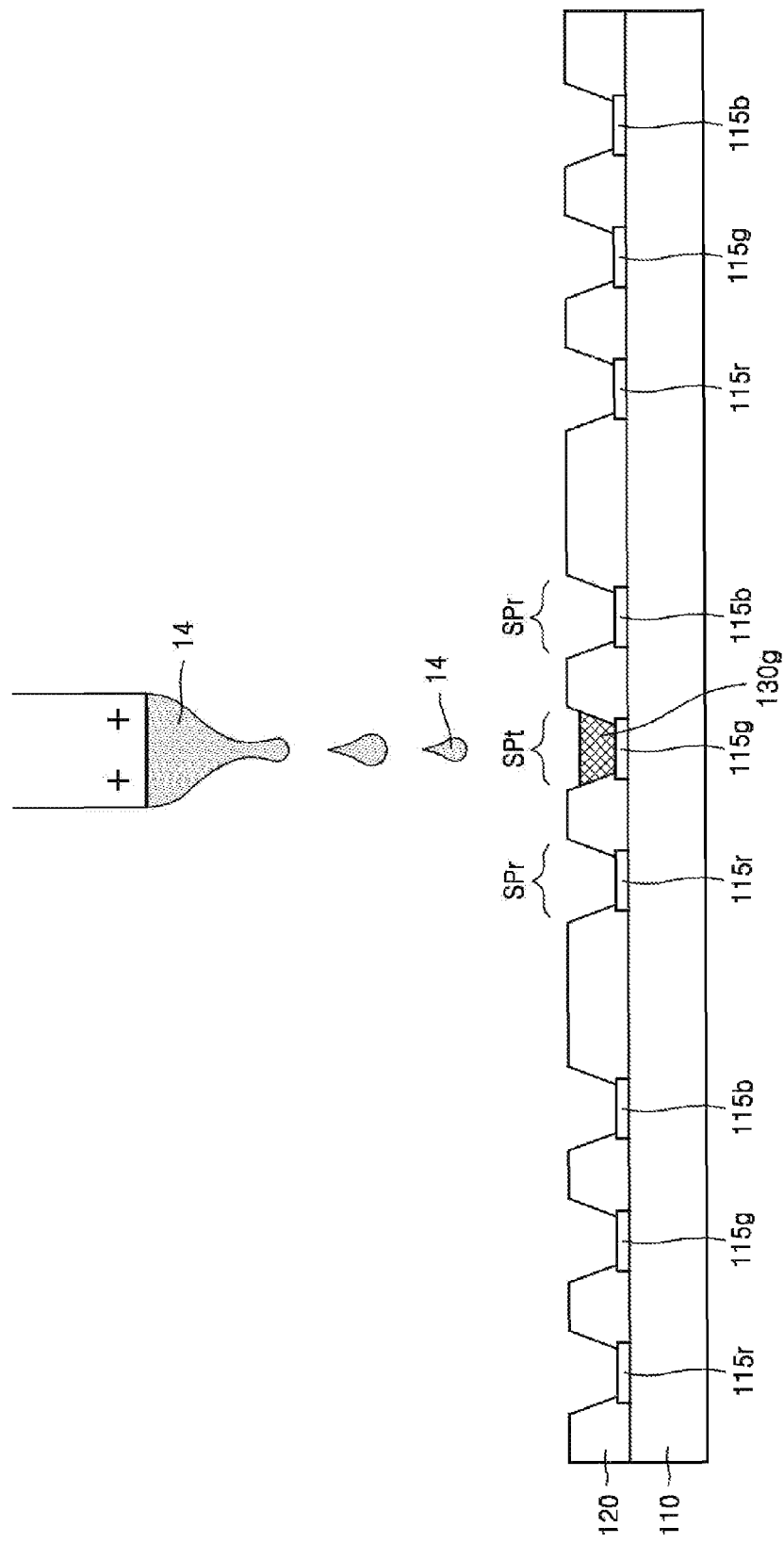

METHOD OF MANUFACTURING ORGANIC LIGHT-EMITTING DEVICE

RELATED APPLICATION

This application claims priority to Korean Patent Application No. 10-2015-0059105, filed on Apr. 27, 2015, and all the benefits accruing therefrom under 35 U.S.C. §119, the contents of which in their entireties are herein incorporated by reference.

BACKGROUND

1. Field

The disclosure relates to a method of manufacturing an organic light-emitting device, and more particularly, to a method of forming an organic material layer of the organic light-emitting device.

2. Description of the Related Art

Organic light-emitting devices are active emission display devices having characteristics such as wide viewing angles, high contrast ratios, and short response times. Thus, organic light-emitting devices are considered as next generation display devices.

An organic light-emitting device typically includes an anode prepared by forming a predetermined pattern on a transparent insulating substrate formed of glass or another material; and an organic material and a cathode sequentially stacked on the anode. When a voltage is applied to the prepared anode and cathode of the organic light-emitting device, holes provided from the anode may move toward an emission layer through a hole transport layer, and electrons provided from the cathode may move toward the emission layer through an electron transport layer. The holes and the electrons are recombined in the emission layer to produce excitons. Such excitons change from an excited state to a ground state, thereby displaying an image as organic molecules in the emission layer emit light In order to manufacture an organic light-emitting device that displays a full-color image, a plurality of sub-pixels, for example, red (R), green (G) and blue (B) sub-pixels, are generally formed on a substrate by using a mask having an opening part of a predetermined pattern.

SUMMARY

Provided is a method of manufacturing an organic light-emitting device by using an organic solution spray apparatus.

Additional aspects will be set forth in part in the description which follows and, in part, will be apparent from the description, or may be learned by practice of the presented embodiments.

According to an embodiment of the invention, a method of manufacturing an organic light-emitting device including a plurality of pixels using an organic solution spray apparatus, where each of the pixels includes a plurality of sub-pixels having different colors from one another, the method includes preparing a substrate on which a plurality of sub-pixel regions is defined; generating a potential difference between a nozzle of the organic solution spray apparatus and the sub-pixel regions; spraying an organic solution from the nozzle of the organic solution spray apparatus to the sub-pixel regions; and forming an organic material layer by selectively depositing the organic solution to the sub-pixel regions using the potential difference between the nozzle and the sub-pixel regions.

In an embodiment, each of the sub-pixel regions may be defined by a lower electrode disposed on the substrate and connected to a thin film transistor.

In an embodiment, the generating the potential difference between the nozzle of the organic solution spray apparatus and the sub-pixel regions may include applying a voltage to the sub-pixel regions through the thin film transistor.

In an embodiment, the method may further include forming an upper electrode on the organic material layer.

In an embodiment, the generating the potential difference between the nozzle of the organic solution spray apparatus and the sub-pixel regions may include applying a positive (+) potential to the nozzle of the organic solution spray apparatus.

In an embodiment, the forming the organic material layer may include selectively depositing the organic solution in the sub-pixel region having the lowest potential among the sub-pixel regions.

In an embodiment, the generating the potential difference between the nozzle of the organic solution spray apparatus and the sub-pixel regions may further include applying an electric potential lower than an electric potential of the nozzle to the sub-pixel regions.

In an embodiment, the organic solution may be dispersed and sprayed from the nozzle to an area having a diameter greater than a diameter of the nozzle.

In an embodiment, the organic solution may be sprayed to cover at least two of the sub-pixel regions.

In an embodiment, the diameter of the nozzle may be in a range of about 50 micrometers ($\mu$m) to about 100 $\mu$m, and a voltage applied to the nozzle may be in a range of about 7 kilovolts (kV) to about 10 kV.

In an embodiment, the organic solution may be converged and sprayed from the nozzle to cover an area having a diameter less than a diameter of the nozzle.

In an embodiment, a diameter of the nozzle may be in a range of about 50 $\mu$m to about 100 $\mu$m, and a voltage applied to the nozzle may be in a range of about 3 kV to about 5 kV.

In an embodiment, the organic solution may be sprayed to cover at least one of the sub-pixel regions.

In an embodiment, the sub-pixel regions may include first, second and third sub-pixel regions which have different colors from one another.

In an embodiment, the first, second and third sub-pixel regions may include red, green and blue sub-pixel regions.

In an embodiment, the first, second, and third sub-pixel regions may be defined by a first lower electrode connected to a first thin film transistor, a second lower electrode connected to a second thin film transistor, and a third lower electrode connected to a third thin film transistor, respectively.

In an embodiment, the method may further include forming a first organic material layer in the first sub-pixel region by spraying a first organic solution from the nozzle of the organic solution spray apparatus.

In an embodiment, the method may further include forming a second organic material layer in the second sub-pixel region by spraying a second solution from the nozzle of the organic solution spray apparatus; and forming a third organic material layer in the third sub-pixel region by spraying a first organic solution from the nozzle of the organic solution spray apparatus.

In an embodiment, the method may further include forming an upper electrode on the organic material layer.

BRIEF DESCRIPTION OF THE DRAWINGS

These and/or other features of embodiments of the invention will become apparent and more readily appreciated from the following description of exemplary embodiments, taken in conjunction with the accompanying drawings, in which:

FIGS. 15 and 16 are schematic views illustrating an exemplary embodiment of organic solution droplets sprayed from a nozzle having different size and shape by controlling a voltage of the nozzle.

DETAILED DESCRIPTION

Figure 1:
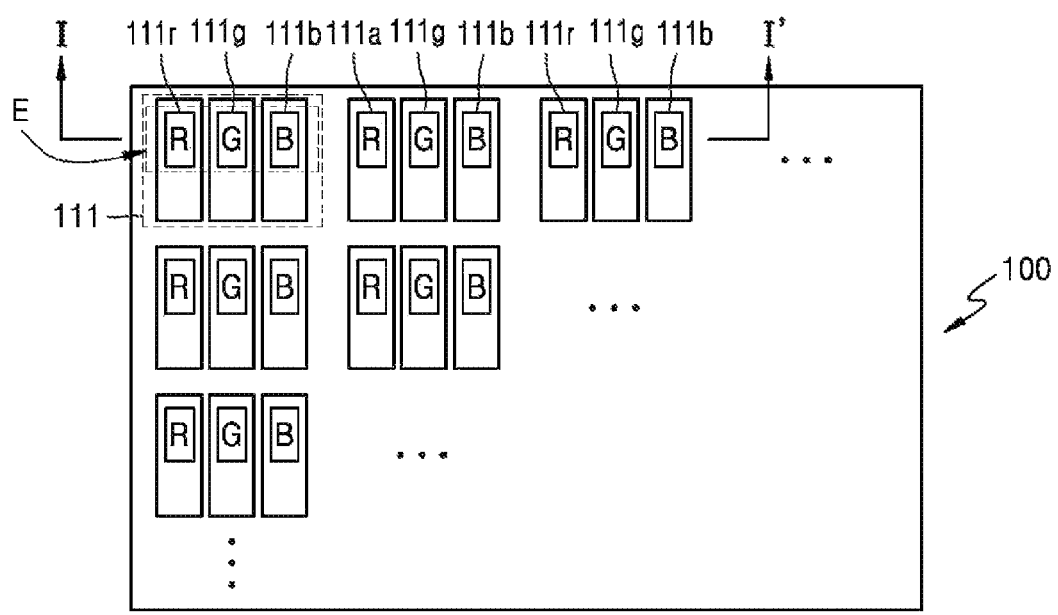
FIG. 1 is a plan view schematically illustrating an exemplary embodiment of an organic light-emitting device.

Reference will now be made in detail to embodiments, examples of which are illustrated in the accompanying drawings, wherein like reference numerals refer to like elements throughout. In this regard, the embodiments described herein may have different forms and should not be construed as being limited to the descriptions set forth herein. Accordingly, the embodiments are merely described below, by referring to the figures, to explain aspects of the description.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims set forth herein.

As the inventive concept allows for various changes and numerous embodiments, particular embodiments will be illustrated in the drawings and described in detail in the written description. However, this is not intended to limit the inventive concept to particular modes of practice, and it is to be appreciated that all changes, equivalents, and substitutes that do not depart from the spirit and technical scope are encompassed in the inventive concept. In the description, certain detailed explanations of the related art are omitted when it is deemed that they may unnecessarily obscure the essence of the inventive concept.

While such terms as "first," "second," etc., may be used to describe various components, such components must not be limited to the above terms. The above terms are used only to distinguish one component from another.

The terms used in the specification are merely used to describe particular embodiments, and are not intended to limit the inventive concept. An expression used in the singular encompasses the expression of the plural, unless it has a clearly different meaning in the context. Herein, it is to be understood that the terms such as "including," "having," and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, features and functions of the inventive concept will be described in detail by describing exemplary embodiments with reference to the accompanying drawings.

FIG. 1 is a plan view schematically illustrating an exemplary embodiment of an organic light-emitting device 100.

Referring to FIG. 1, the organic light-emitting device 100 may include a plurality of pixels 111 on a surface thereof. Each of the pixels 111 may include a plurality of sub-pixels 111*r*, 111*g*, 111*b*. Each of the sub-pixels 111*r*, 111*g*, 111*b* may have an organic material layer, where types of the organic material layers of the sub-pixels 111*r*, 111*g*, 111*b* are different from one another. In one embodiment, for example, the pixel 111 may include first, second and third sub-pixels 111*r*, 111*g*, 111*b*. The first sub-pixel 111*r* may include an organic material layer that emits red light (R), the second sub-pixel 111*g* may include an organic material layer that emits green light (G), and the third sub-pixel 111*b* may include an organic material layer that emits blue light (B). However, the number of sub-pixels in each pixel and colors of the emitted light from sub-pixel are not limited to the embodiment described above, but may vary depending on the application. In one alternative embodiment, for example, the first, second, and third sub-pixels 111*r*, 111*g*, 111*b* may emit light in yellow, magenta, and cyan colors. In an embodiment, the pixel 111 may include more or less than three sub-pixels. In one embodiment, for example, the pixel 111 may include six sub-pixels. In such an embodiment, the sub-pixels may include organic material layers, each of which emits red (R), green (G), blue (B), yellow (Y), magenta (M), or cyan (C) light.

Figure 2:
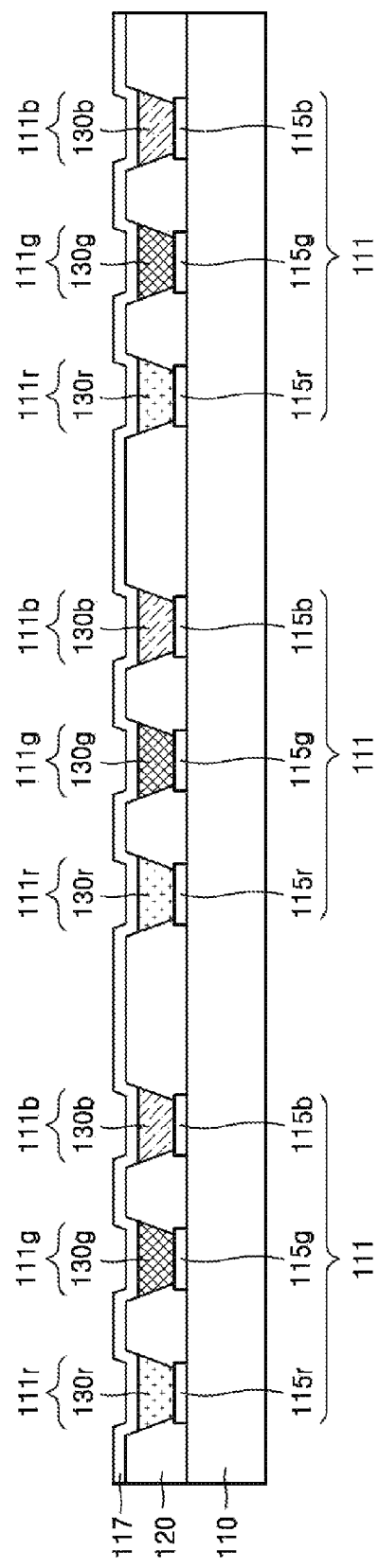
FIG. 2 is a cross-sectional view taken along line I-I' in FIG. 1.

FIG. 2 is a cross-sectional view taken along line I-I' in FIG. 1.

Referring to FIG. 2, an embodiment of the organic light-emitting device 100 may include a substrate 110, first to third lower electrodes 115*r*, 115*g*, 115*b* disposed on the substrate 110. The first to third lower electrodes 115*r*, 115*g*, 115*b* may be separately provided for each of the first to third sub-pixels 111*r*, 111*g*, 111*b*. In one embodiment, for example, the first sub-pixel 111*r* may include the first lower electrode 115*r*, the second sub-pixel 111*g* may include the second lower electrode 115*g*, and the third sub-pixel 115*b* may include the third lower electrode 115*b*, but embodiments of the invention are not limited thereto. In one alternative embodiment, for example, the first to third lower electrodes 115*r*, 115*g*, 115*b* may a common electrode of a plurality of the first to third sub-pixels 111*r*, 111*g*, 111*b*.

The organic light-emitting device 100 is disposed on the substrate 110 and may include a pixel definition layer 120 that surrounds the first to third lower electrodes 115*r*, 115*g*, 115*b*. Openings are defined in the pixel definition layer 120 in areas, where the first to third sub-pixels 111*r*, 111*g*, 111*b* are to be disposed, and thus may define sub-pixel areas. When the pixel definition layer 120 has hills defined between the first to third lower electrodes 115*r*, 115*g*, 115*b*, spaces for first to third organic material layers 130*r*, 130*g*, 130*b* to be disposed may be defined between the hills. In an embodiment, as shown in FIG. 2, the organic light-emitting device 100 may include the pixel definition layer 120. However, the organic light-emitting device 100 prepared according to another exemplary embodiment may not include the pixel definition layer 120. In such an embodiment, the first to third organic material layers 130*r*, 130*g*, 130*b* may be stacked without the hill-shaped structures of the pixel definition layer 120. In such an embodiment, the sub-pixel areas may be defined as areas on which the first to third organic material layers 130*r*, 130*g*, 130*b* are stacked on the first to third lower electrode 115*r*, 115*g*, 115*b*.

The organic light-emitting device 100 may include the first to third organic material layers 130*r*, 130*g*, 130*b* that are disposed on the first to third lower electrodes 115*r*, 115*g*, 115*b*; and an upper electrode 117 disposed on the first to third organic material layers 130*r*, 130*g*, 130*b*. The first to third organic material layers 130*r*, 130*g*, 130*b* may be disposed in the first to third sub-pixels 111*r*, 111*g*, 111*b*, respectively. In one embodiment, for example, a first organic material layer 130*r* may be deposited in the first sub-pixel 115*r*, the second organic material layer 130*g* may be deposited in the second sub-pixel 111*g*, and the third organic material layer 130*b* may be deposited in the third sub-pixel 111*b*. The first organic material layer 130*r* may include a first emission layer that emits light in a first color, the second organic material layer 130*g* may include a second emission layer that emits light in a second color, and the third organic material layer 130*b* may include a third emission layer that emits light in a third color. The first emission layer may include an organic material capable of emitting light of the first color. The second and third emission layers may include organic materials capable of emitting lights of the second and third colors, respectively. Thus, in such an embodiment, when an appropriate voltage is applied to the upper electrode 117 and the first to third lower electrodes 115*r*, 115*g*, 115*b*, the first to third first to third sub-pixels 111*r*, 111*g*, 111*b* may emit light of the first, second, and third colors, respectively.

Figure 3:
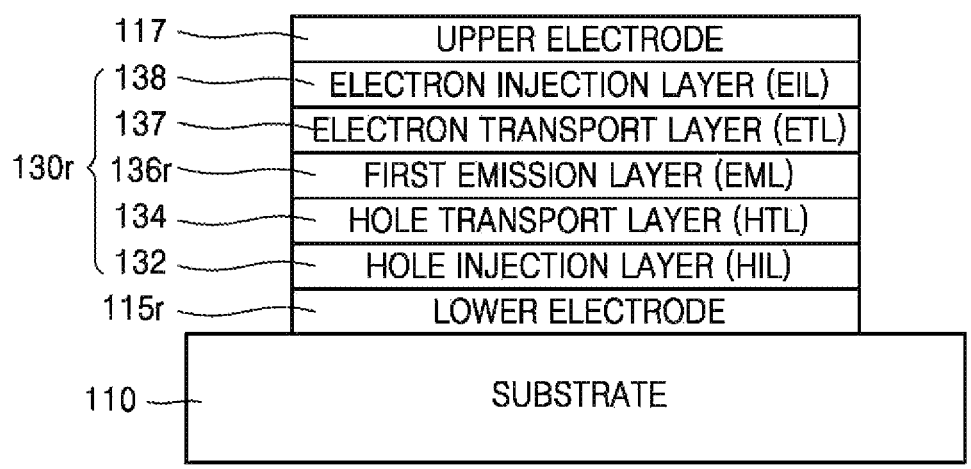
FIG. 3 is a cross-sectional view of an embodiment of a first organic material layer among organic material layers.

FIG. 3 is a cross-sectional view of an embodiment of the first organic material layer 130*r* among the first to third organic material layers 130*r*, 130*g*, 130*b* described above.

Referring to FIG. 3, in an embodiment, the first organic material layer 130*r* may be disposed on the lower electrode 115*r*. The first organic material layer 130*r* may include the first emission layer 136*r* capable of emitting light of the first color. The first color may be one of red (R), green (G), and blue (B). In one embodiment, for example, the first color may be one of yellow (Y), magenta (M), and cyan (C). The first organic material layer 130*r* may further include an interlayer in addition to the first emission layer 136*r*. In one embodiment, for example, the first organic material layer 130*r* may further include a hole injection layer 132 or a hole transport layer 134 between the lower electrode 115*r* and the first emission layer 136*r*. In such an embodiment, the lower electrode 115*r* may serve as an anode. The hole transport layer 134 may include a non-conductive material such as poly-(2,4)-ethylene-dihydroxy thiophene ("PEDOT") or polyaniline ("PANI").

In an embodiment, the first organic material layer 130*r* may further include an electron transport layer 137 or an electron injection layer 138 that is disposed between the upper electrode 117 and the first organic material layer 136*r*. In such an embodiment, the upper electrode 117 may serve as a cathode. In an embodiment, where the upper electrode 117 serves as an anode and the lower electrode 115*r* as a cathode, the hole injection layer 132 and the hole transport layer 134 may be disposed between the upper electrode 117 and the first organic material layer 136*r*. The second and third colors may be colors selected from red (R), green (G), and blue (B), other than the first color. In one alternative embodiment, for example, the second and third colors may be colors selected from yellow (Y), magenta (M), and cyan (C), other than the first color.

Referring back to FIG. 2, the first to third lower electrode 115*r*, 115*g*, 115*b* may be connected to a thin film transistor (not shown in FIG. 2) disposed in the substrate 110. Voltages of the first to third lower electrodes 115*r*, 115*g*, 115*b* may be controlled by the thin film transistor.

Figure 4:
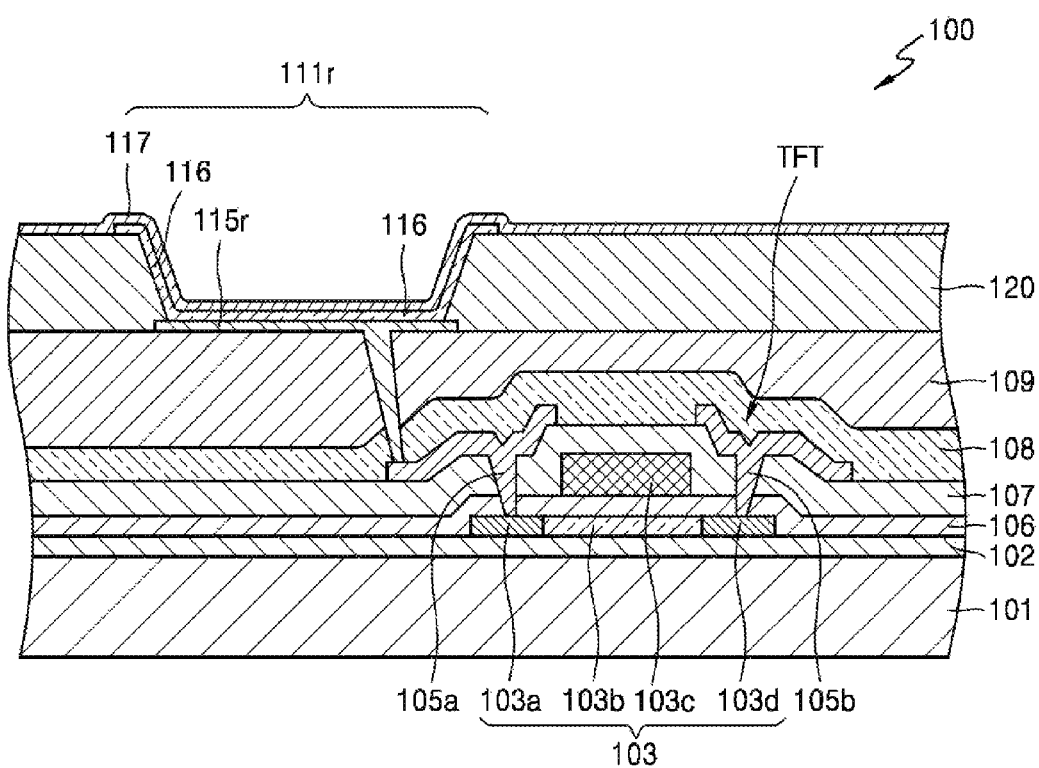
FIG. 4 is a cross-sectional view illustrating an embodiment of a substrate shown in FIG. 2 including a thin film transistor.

FIG. 4 is a cross-sectional view of an embodiment of the substrate 110 of FIG. 2 including a thin film transistor.

Referring to FIG. 4, in an embodiment, the substrate 110 includes a base substrate 101. The base substrate 101 may include glass or plastic, for example. In such an embodiment, the substrate 110 may include a buffer layer 102 disposed on the base substrate 101. The buffer layer 102 may include an organic material or an inorganic material, or may have a structure including an organic material and an inorganic material that are alternately stacked on each other. The buffer layer 102 blocks inflow of oxygen and moisture from the outside and may effectively prevent diffusion of moisture or impurities generated from the base substrate 101. The substrate 110 may include the thin film transistor prepared on top of the buffer layer 102. In an embodiment, as shown in FIG. 4, the thin film transistor may be a top gate-type thin film transistor, but not being limited thereto. In an alternative embodiment, the thin film transistor may have a different structure such as a bottom gate-type thin film transistor.

In an embodiment, where the substrate 110 includes the top gate-type thin film transistor, the substrate 110 may include a semiconductor active layer 103 formed on the buffer layer 102, a gate insulating layer 106, a gate electrode 103*c*, an interlayer insulating layer 107, a source electrode 105*a*, a drain electrode 105*b*, a passivation layer 108, and a planarization layer 109.

The semiconductor active layer 103 may be doped with N-type or P-type impurity ions and thus may include a source region 103*a* and a drain region 103*d*. The semiconductor active layer 103 may be disposed at a region between the source region 103*a* and the drain region 103*d* and thus may include a channel region 103*b* that is not doped with impurities. The gate insulating layer 106 may be deposited on the semiconductor active layer 103. The gate insulating layer 106 may be a single layer including $SiO_2$ or may have a bilayer structure including $SiO_2$ and SiNx.

The gate electrode 103*c* may be disposed on the gate insulating layer 106. The gate electrode 103*c* may be connected to a gate line (not shown) that transmits a gate-on or gate-off signal, which turns on or off the thin film transistor. The gate electrode 103*c* may include a single metal or various metals. The gate electrode 103*c* may be defined by a single layer including Mo, MoW, Cr, an Al alloy, Mg, Al, Ni, W, or Au or may have a multi-layer structure including Mo, MoW, Cr, an Al alloy, Mg, Al, Ni, W, Au or a combination thereof.

The interlayer insulating layer 107 may be disposed on the gate electrode 103*c*. Through a contact hole defined through the interlayer insulating layer 107, e.g., formed by removing a part of the interlayer insulating layer 107, the source electrode 105*a* is electrically connected to the source region 103*a*, and the drain electrode 105*b* is electrically connected to the drain region 103*d*. The interlayer insulating layer 107 may include or be formed of an insulating material such as $SiO_2$, SiNx, or an insulating organic material. The passivation layer 108 is disposed on the source electrode 105*a* and the drain electrode 105*b*, the passivation layer 108 including SiO2 or SiNx. The planarization layer 109 may be disposed on the passivation layer 108, and the planarization layer 109 may include an organic material such as acryl, polyimide, or benzocyclobutene ("BOB").

At least one of the source electrode 105*a* and the drain electrode 105*b* may be electrically connected to one of the first to third the lower electrodes 115*r*, 115*g*, 115*b*. The first to third lower electrode 115*r*, 115*g*, 115*b* may be a transparent electrode or a reflective electrode depending on characteristics of the organic light-emitting device 100. In one embodiment, where the first to third lower electrode 115*r*, 115*g*, 115*b* is a transparent electrode, the first to third lower electrode 115*r*, 115*g*, 115*b* may include indium tin oxide ("ITO"), indium zinc oxide ("IZO"), ZnO, or $In_2O_3$, for example. In an embodiment, where the first to third lower electrode 115*r*, 115*g*, 115*b* is a reflective electrode, a reflective layer may include or be formed of Ag, Mg, Al, Pt, Pd, Au, Ni, Nd, Ir, Cr, or a compound thereof, for example, and then ITO, IZO, ZnO, or $In_2O_3$ may be deposited on the reflective layer. Since at least one of the source electrode 105*a* and the drain electrode 105*b* of the thin film transistor is connected to the first to third lower electrode 115*r*, 115*g*, 115*b*, the thin film transistor may apply a predetermined voltage to the first to third lower electrode 115*r*, 115*g*, 115*b*. When the thin film transistor applies the predetermined voltage to the first to third lower electrode 115*r*, 115*g*, 115*b*, the thin film transistor may serve as a switching device capable of controlling a light emitting status of the organic material layer that is stacked on the first to third lower electrode 115*r*, 115*g*, 115*b*. The thin film transistor may apply a predetermined voltage to the first to third lower electrode 115*r*, 115*g*, 115*b* when the organic material layer is stacked on the first to third lower electrode 115*r*, 115*g*, 115*b*.

Figure 5:
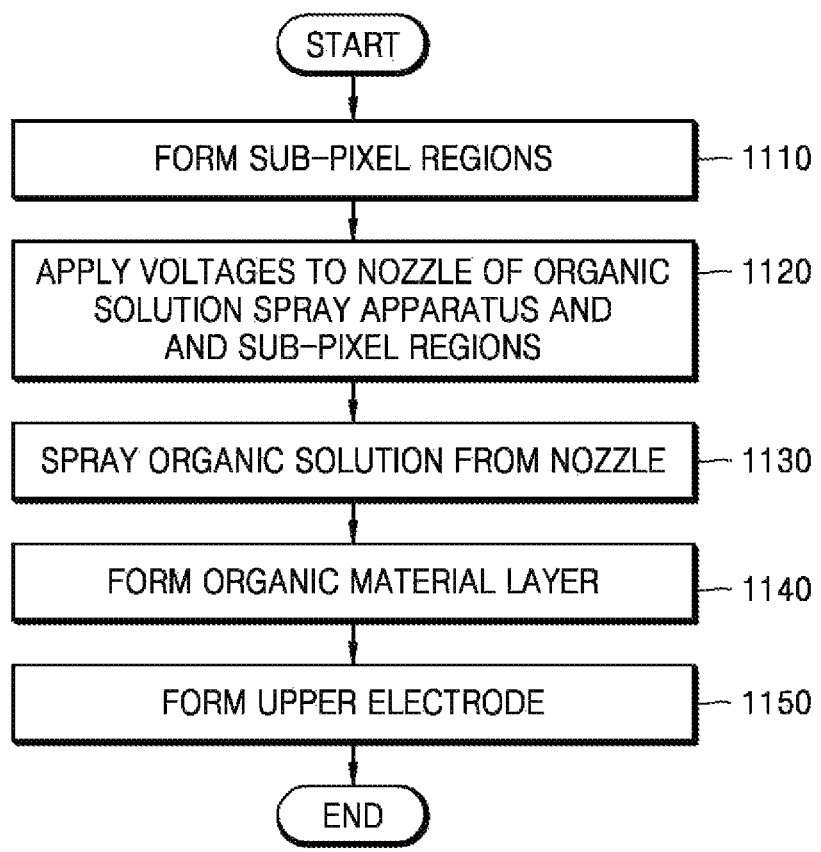
FIG. 5 is a flowchart that illustrates an exemplary embodiment of a method of manufacturing the organic light-emitting device shown in FIGS. 1 to 4.

FIG. 5 is a flowchart that illustrates an exemplary embodiment of a method of manufacturing the organic light-emitting device 100 described with reference to FIGS. 1 to 4.

Referring to FIG. 5, the method of manufacturing the organic light-emitting device 100, according to an exemplary embodiment, may include (1110) providing, e.g., forming, a plurality of sub-pixel regions, (1120) applying voltages to a nozzle of an organic solution spray apparatus and the sub-pixel regions, (1130) spraying an organic solution from the nozzle of the organic solution spray apparatus, and (1140) forming organic material layers 130*r*, 130*g*, 130*b* by selectively depositing the organic solution to the sub-pixel regions due to voltage differences between the nozzle and the sup-pixel regions. In such an embodiment, the method of manufacturing the organic light-emitting device 100 may include (1150) providing, e.g., forming, an upper electrode 117 on the organic material layers 130*r*, 130*g*, 130*b*.

Figure 6:
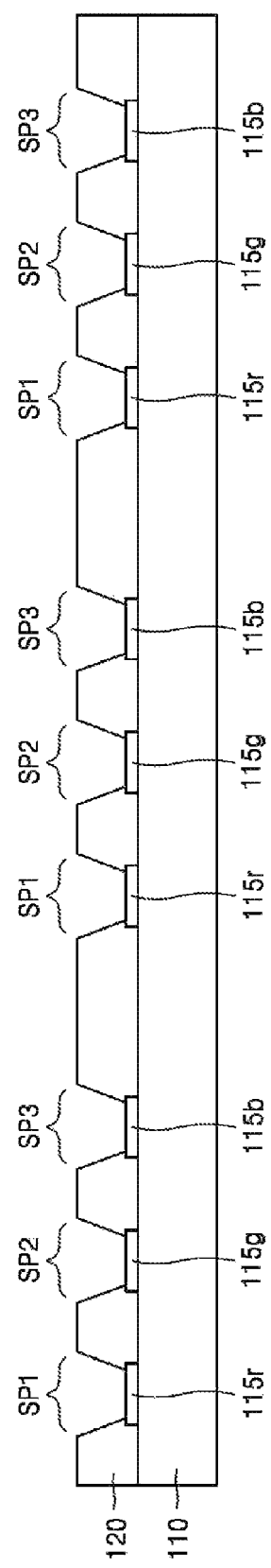
FIG. 6 is a schematic view illustrating a process of preparing sub-pixel regions shown in FIG. 5.

FIG. 6 is a schematic view illustrating an operation (1110) of preparing the sub-pixel regions SP1, SP2, SP3 described with reference to FIG. 5.

Referring to FIG. 6, the first to third lower electrode 115*r*, 115*g*, 115*b* may be formed on locations respectively corresponding to the first to third sub-pixels 111*r*, 111*g*, 111*b* on the substrate 110. In such an embodiment, a pixel definition layer 120 may be formed on the substrate 110. The pixel definition layer 120 may include openings that expose the first to third lower electrode 115*r*, 115*g*, 115*b*. The openings of the pixel definition layer 120 may define the sub-pixel regions SP1, SP2, SP3 on the substrate 110. Each of the sub-pixel regions SP1, SP2, SP3 may include the first to third lower electrode 115*r*, 115*g*, 115*b*. The first to third lower electrode 115*r*, 115*g*, 115*b* may be respectively divided into each of the sub-pixel regions SP1, SP2, SP3. In one embodiment, for example, a first sub-pixel region SP1 may include a first lower electrode 115*r*, a second sup-pixel region SP2 may include a second lower electrode 115*g*, and a third sub-pixel region SP3 may include a third lower electrode 115*b*. The sub-pixel regions SP1, SP2, SP3 may be defined by the first to third lower electrode 115*r*, 115*g*, 115*b*, and regions, where the pixel definition layer 120 surrounds the first to third lower electrode 115*r*, 115*g*, 115*b*.

The pixel definition layer 120 may be an insulating layer, but embodiments are not limited thereto. In one embodiment, for example, the pixel definition layer 120 may include or be formed of an organic material or an inorganic material. In one embodiment, for example, the pixel definition layer 120 may include or be formed of an organic material such as polyimide, polyamide, benzocyclobutene, acryl resin, or phenol resin, or an inorganic material such as SiNx. In an embodiment, the pixel definition layer 120 may be formed as a single layer or to have a multi-layer structure having at least two layers, but embodiments are not limited thereto.

FIG. 6 illustrates that spaces for the organic solution to be deposited are formed through the pixel definition layer 120, but embodiments are not limited thereto. In one alternative embodiment, for example, when the sub-pixel regions SP1, SP2, SP3 are formed, the pixel definition layer 120 may not be formed. In such an embodiment, the sub-pixel regions SP1, SP2, SP3 may be defined as including the lower electrode 115r, 115g, 115b and regions of the lower electrode 115r, 115g, 115b, on which the organic solution is deposited.

As shown in FIG. 6, when the sub-pixel regions SP1, SP2, SP3 are defined, the organic solution may be deposited on the first to third lower electrode 115r, 115g, 115b of the sub-pixel regions SP1, SP2, SP3, and thus the organic material layers 130r, 130g, 130b (in FIG. 2) may be formed on the first to third lower electrode 115r, 115g, 115b. Referring back to FIG. 5, the method of manufacturing the organic light-emitting device 100 may include an operation (1120) of applying predetermined voltages to the nozzle of the organic solution spray apparatus and the sub-pixel regions SP1, SP2, SP3 and an operation (1130) of spraying the organic solution from the nozzle of the organic solution spray apparatus.

Figure 7:
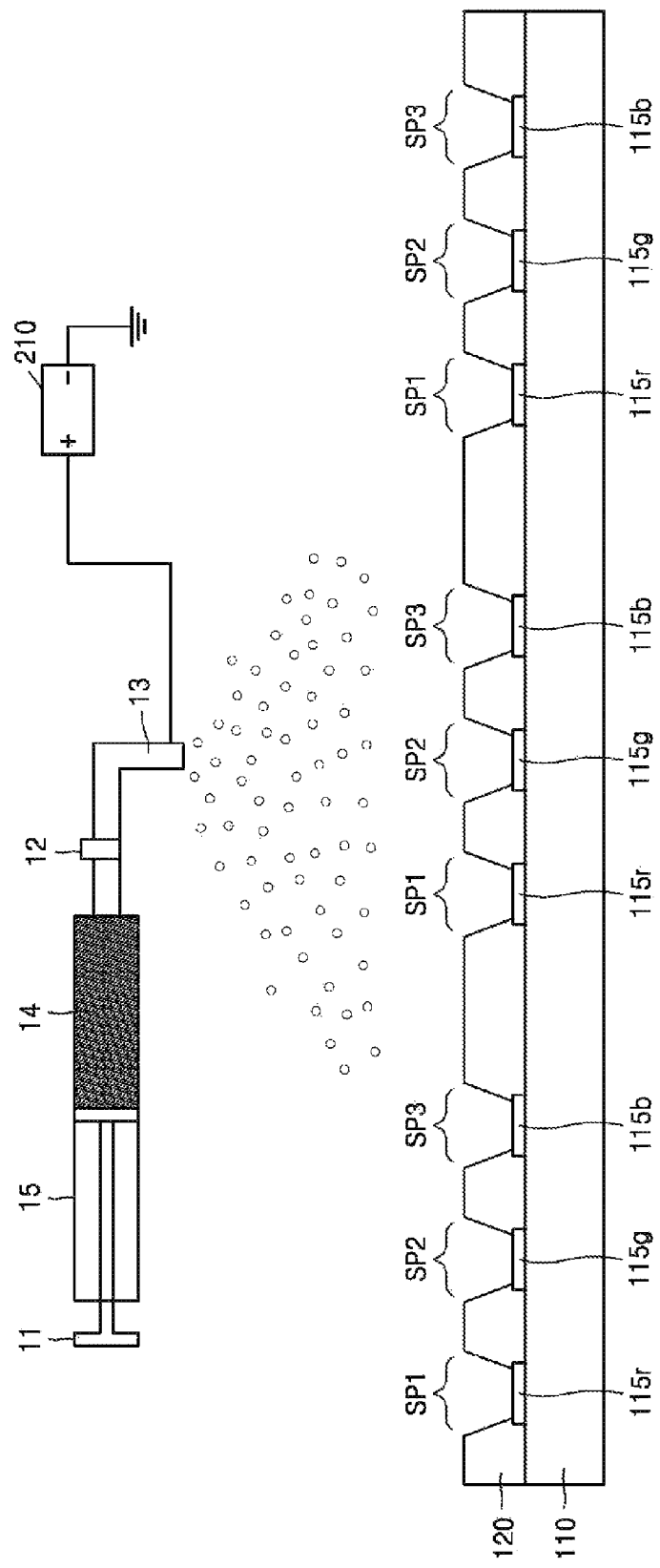
FIG. 7 is a schematic view that illustrates an operation of spraying an organic solution from an organic solution spray apparatus, according to another exemplary embodiment.

FIG. 7 is a schematic view that illustrates an operation of spraying an organic solution 14 from an organic solution spray apparatus 10, according to some of exemplary embodiments.

Referring to FIG. 7, a method of manufacturing an organic light-emitting device, according to exemplary embodiments of the invention, may include spraying the organic solution 14 to at least one of the sub-pixel regions SP1, SP2, SP3 by using the organic solution spray apparatus 10. The organic solution spray apparatus 10 may include a nozzle 13, through which the organic solution 14 is sprayed. In one embodiment, for example, the organic solution spray apparatus 10 may include a case 15 that stores the organic solution 14 and a piston 11 that pushes the organic solution 14 to the nozzle 13. In such an embodiment, the organic solution spray apparatus 10 may include a flow meter 12 that is located in the middle of a flow pathway, through which the organic solution 14 is sprayed. An amount of the organic solution 14 being sprayed through the nozzle 13 may be appropriately controlled by controlling a rate of flow that is measured by using the flow meter 12. However, embodiments of the organic solution spray apparatus 10 are not limited thereto, and the organic solution spray apparatus 10 may spray the organic solution 14 through the nozzle 13 by having a different configuration.

The nozzle 13 of the organic solution spray apparatus 10 may be connected to a voltage application apparatus 210. When the organic solution 14 is sprayed to the sub-pixel regions SP1, SP2, SP3, a predetermined voltage may be applied to the nozzle 13 by using the voltage application apparatus 210. In one embodiment, for example, the voltage application apparatus 210 may utilize a voltage of the nozzle 13 to be a positive (+) voltage with respect to a ground voltage. Here, a shape of the organic solution 14 being sprayed from the nozzle 13 may be controlled by controlling the voltage of the nozzle 13. In one embodiment, for example, as shown in FIG. 7, the voltage application apparatus 210 may control a voltage of the nozzle 13 in a way such that the organic solution 14 may be sprayed to a wide area having a diameter greater than a diameter of the nozzle 13. In such an embodiment, a diameter of the nozzle 13 may be in a range of about 50 μm to about 100 μm, and a voltage applied to the nozzle 13 may be in a range of about 7 kilovolts (kV) to about 10 kV with respect to the ground voltage. Such ranges are merely examples, and embodiments are not limited thereto. In one embodiment, for example, when the diameter of the nozzle 13 changes, a range of the voltage applied to the nozzle 13 may change as well. In one embodiment, for example, when the diameter of the nozzle 13 is set about 150 μm, the voltage applied to the nozzle 13 may be about 2.8 kV so that the organic solution 14 may be sprayed to a wide area having a diameter greater than the diameter of the nozzle 13. Alternatively, when the diameter of the nozzle 13 is reduced to be in a range of about 50 μm to about 100 μm, patterning a fine region may be easily performed.

As shown in FIG. 7, when the organic solution 14 is sprayed to an area having a diameter greater than that of the nozzle 13, droplets of the organic solution 14 sprayed through the nozzle 13 may cover the plurality of sub-pixel regions SP1, SP2, SP3. In such an embodiment, the organic solution 14 may be simultaneously deposited to the plurality of sub-pixel regions SP1, SP2, SP3, and thus the organic material layers 130r, 130g, 130b may be formed. However, as described above, when each of the pixels 111 includes the first, second, and third sub-pixel 111r, 111g, 111b that emit light of different colors, the organic solution 14 that emits light of different color may be controlled to be deposited to the first to third sub-pixel regions SP1, SP2, SP3, respectively. Therefore, according to an embodiment, an organic solution of the first color may be selectively deposited to the first sub-pixel region SP1, an organic solution of the second color may be selectively deposited to the second sub-pixel region SP2, and an organic solution of the third color may be selectively deposited to the third sub-pixel region SP3. In an embodiment, the first, second, and third colors may be each selected from red (R), green (G), and blue (B). In other embodiments, the first, second, and third colors may be each selected from yellow (Y), magenta (M), and cyan (C).

Figure 8:
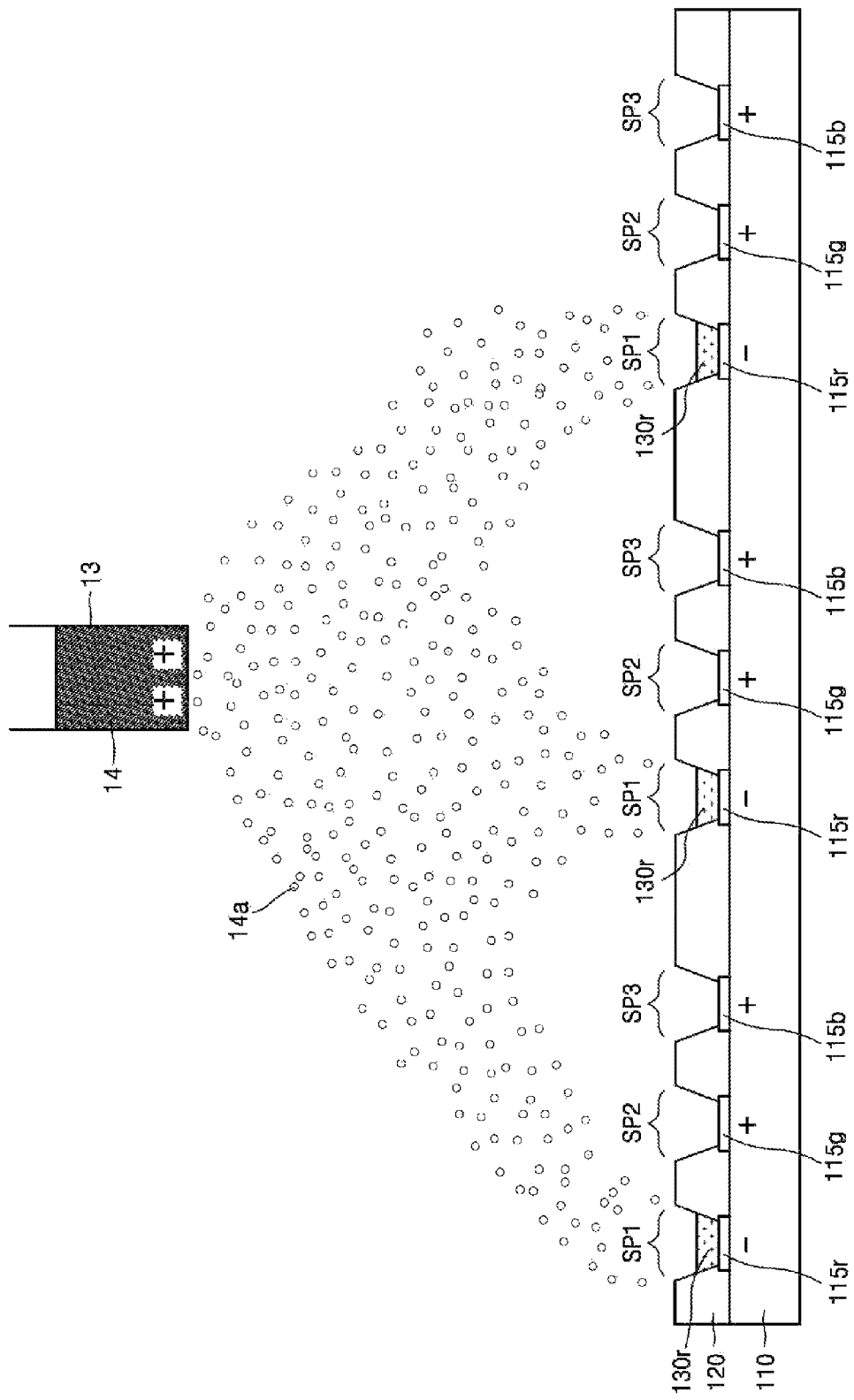
FIG. 8 is a schematic view that illustrates selective deposition of first organic solution droplets including a light-emitting material of a first color to a first sub-pixel region.

FIG. 8 is a schematic view that describes selective deposition of first organic solution droplets 14a including a light-emitting material of the first color to the first sub-pixel region SP1.

Referring to FIG. 8, the nozzle 13 may be induced with a positive (+) voltage with respect to the ground voltage. A diameter and the voltage of the nozzle 13 may be appropriately controlled for the first organic solution droplets 14a to be sprayed to a wide area. In one embodiment, for example, the diameter of the nozzle 13 may be controlled to be in a range of about 50 μm to about 100 μm, and the voltage applied to the nozzle 13 may be controlled to be in a range of about 7 kV to about 10 kV with respect to the ground voltage. In such an embodiment, a droplet sprayed area of the organic solution may cover the plurality of sub-pixel regions SP1, SP2, SP3 to spray the first organic solution droplets 14a from the nozzle 13 to a wide area.

In such an embodiment, a voltage applied to the first sub-pixel region SP1 and voltages applied to the second and third sub-pixel regions SP2 and SP3 may be set different from each other in the process 1120 shown in FIG. 5, to selectively deposit the first organic solution droplets 14a sprayed from the nozzle 13 to the first sub-pixel region SP1 only. The voltages of the first to third sub-pixel regions SP1, SP2, SP3 may be controlled by applying voltages to the first to third lower electrode 115r, 115g, 115b included in the first to third sub-pixel regions SP1, SP2, SP3. The thin film transistor shown in FIG. 4 may be used to apply voltages to the first to third lower electrode 115r, 115g, 115b.

As shown in FIG. 8, when the first organic solution droplets 14a are sprayed, a negative (−) voltage may be applied to the first sub-pixel region SP1. When the first organic solution droplets 14a are sprayed, positive (+) voltages may be applied to the second sub-pixel region SP2 and the third sub-pixel region SP3. When the negative (−) voltage is applied to the first sub-pixel region SP1, the first organic solution droplets 14a with a positive charge may be selectively deposited to the first sub-pixel region SP1 by Coulombic electrostatic forces.

In an embodiment, as described above, the voltage applied to the first sub-pixel region SP1 and the voltages applied to the second and third sub-pixel regions SP2 and SP3 have opposite charges, but embodiments are not limited thereto. In one alternative embodiment, for example, the first sub-pixel region SP1 may be grounded to a ground voltage, and positive (+) voltages may be applied to the second and third sub-pixel regions SP2 and SP3. Alternatively, a negative (−) voltage may be applied to the first sub-pixel region SP1, and the second and third sub-pixel regions SP2 and SP3 may be grounded to a ground voltage. In some embodiments, negative (−) voltages may be applied to all of the sub-pixel regions SP1, SP2, SP3, and a voltage difference between the first sub-pixel region SP1 and the nozzle 13 may be set to be the greatest. In some embodiments, positive (+) voltages may be applied to all of the sub-pixel regions SP1, SP2, SP3, and a voltage difference between the first sub-pixel region SP1 and the nozzle 13 may be set to be the greatest by setting the voltage of the first sub-pixel region SP1 as the lowest. However, when the voltage of the first sub-pixel region SP1 is set higher than the voltage of the nozzle 13, deposition of the first organic solution droplets 14a may be difficult due to Coulombic repulsion forces. Thus, the voltage of the first sub-pixel region SP1 may be set lower than that of the nozzle 13. In an embodiment, as described above, the first sub-pixel region SP1 may have a voltage that is lower than those of the second and third sub-pixel regions SP2 and SP3. FIG. 8 illustrates an embodiment where a positive (+) voltage is applied to the nozzle 13, but embodiments are not limited thereto. In one alternative embodiment, for example, when a negative (−) voltage is applied to the nozzle 13, the highest voltage may be applied to the first sub-pixel region SP1. As described above, the voltages of the sub-pixel regions SP1, SP2, SP3 may be variously controlled to selectively deposit the first organic solution droplets 14a to the first sub-pixel region SP1.

Figure 9:
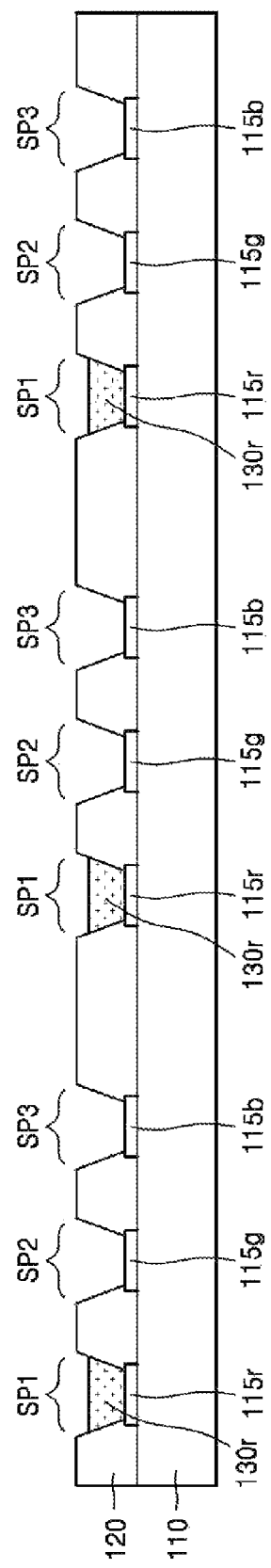
FIG. 9 is a schematic view showing the result of the deposition process of the first organic solution droplets shown in FIG. 8.

FIG. 9 is a schematic view showing the result of the deposition process of the first organic solution droplets 14a shown in FIG. 8.

Referring to FIG. 9, the first organic solution droplets 14a may be selectively deposited to the first sub-pixel region SP1 only. In such an embodiment, the first organic material layer 130r may be formed in the first sub-pixel region SP1. The first organic material layer 130r may include an organic material, which emits light of the first color. Therefore, when a predetermined voltage is applied to the first organic material layer 130r through the upper electrode 117 and the first lower electrode 115r shown in FIG. 2, the first organic material layer 130r may emit light of the first color.

Figure 10:
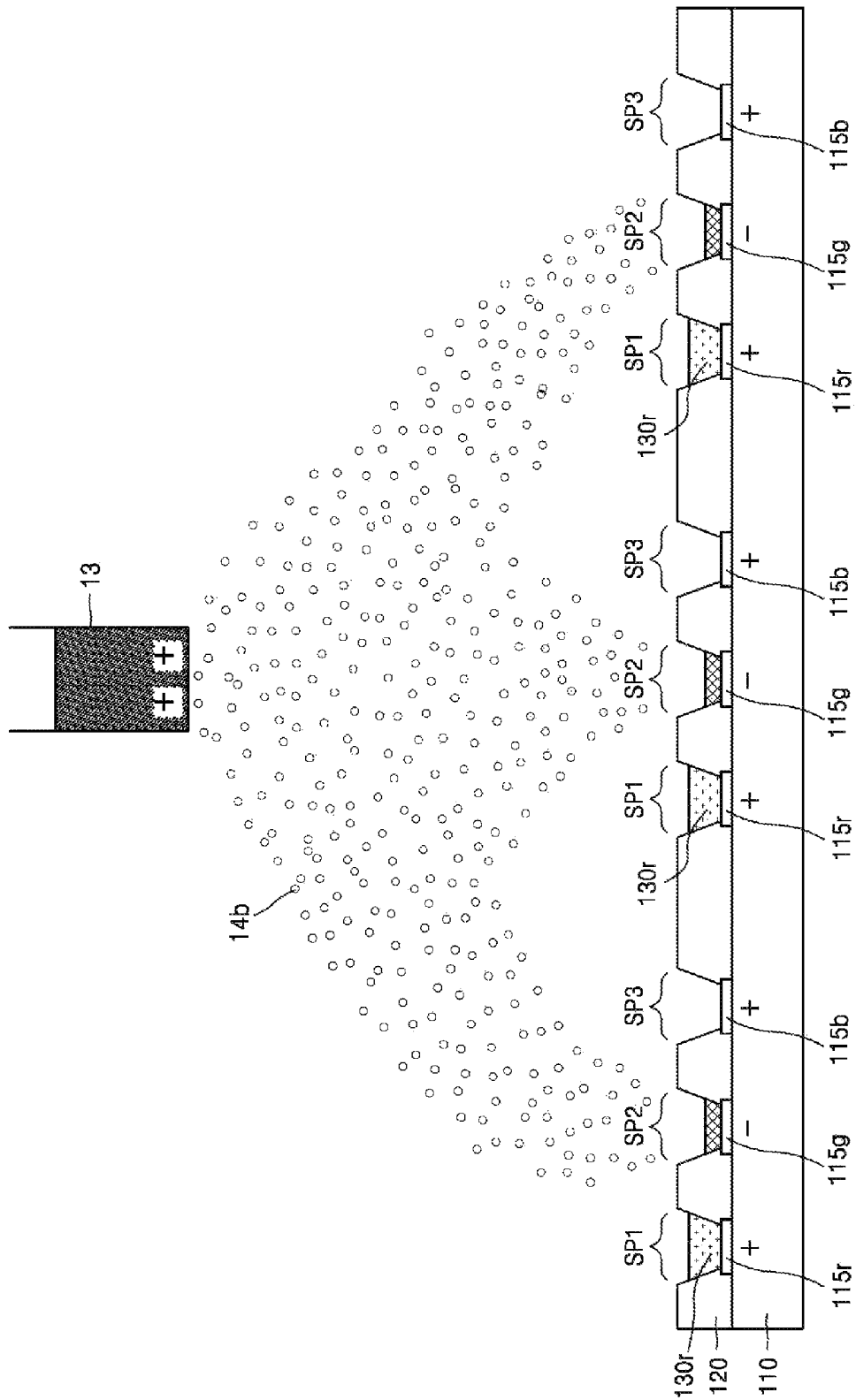
FIG. 10 is a schematic view that illustrates second organic solution droplets including a light-emitting material of a second color being selectively deposited to a second sub-pixel region.

FIG. 10 is a schematic view that describes second organic solution droplets 14b including a light-emitting material of the second color being selectively deposited to the second sub-pixel region SP2.

Referring to FIG. 10, the second organic solution droplets 14b sprayed from the nozzle 13 may be selectively deposited to the second sub-pixel region SP2. In such an embodiment, a voltage applied to the second sub-pixel SP2 and voltages applied to the first and third sub-pixels SP1 and SP3 may be set different from each other. In one embodiment, for example, as shown in FIG. 10, when the second organic solution droplets 14b are sprayed, a negative (−) voltage may be applied to the second sub-pixel region SP2. When the second organic solution droplets 14b are sprayed, positive (+) voltages may be applied to the first and third sub-pixel regions SP1 and SP3. When the negative (−) voltage is applied to the second sub-pixel region SP2, the second organic solution droplets 14b with a positive (+) charge may be selectively deposited to the second sub-pixel region SP2 by Coulombic electrostatic forces.

In an embodiment as described above, the voltage applied to the second sub-pixel region SP2 and the voltages applied to the first and third sub-pixel regions SP1 and SP3 have opposite charges, but embodiments are not limited thereto. In one alternative embodiment, for example, the second sub-pixel region SP2 may be grounded to a ground voltage, and positive (+) voltages may be applied to the first and third sub-pixel regions SP1 and SP3. Alternatively, a negative (−) voltage may be applied to the second sub-pixel region SP2, and the first and third sub-pixel regions SP1 and SP3 may be grounded to a ground voltage. In some embodiments, negative (−) voltages may be applied to all of the sub-pixel regions SP1, SP2, SP3, and a voltage difference between the second sub-pixel region SP2 and the nozzle 13 may be set to be the greatest. In some embodiments, positive (+) voltages may be applied to all of the sub-pixel regions SP1, SP2, SP3, and a voltage difference between the second sub-pixel region SP2 and the nozzle 13 may be set to be the greatest by setting the voltage of the second sub-pixel region SP2 as the lowest. However, when the voltage of the second sub-pixel region SP2 is set higher than the voltage of the nozzle 13, deposition of the second organic solution droplets 14b may be difficult due to Coulombic repulsion forces. Thus, the voltage of the second sub-pixel region SP2 may be set lower than that of the nozzle 13. In an embodiment, as described above, the second sub-pixel region SP2 may have a voltage that is lower than those of the first and third sub-pixel regions SP1 and SP3. FIG. 10 illustrates an embodiment where a positive (+) voltage is applied to the nozzle 13, but embodiments are not limited thereto. In one alternative embodiment, for example, when a negative (−) voltage is applied to the nozzle 13, the highest voltage may be applied to the second sub-pixel region SP2. As described above, the voltages of the sub-pixel regions SP1, SP2, SP3 may be variously controlled to selectively deposit the second organic solution droplets 14b to the second sub-pixel region SP2.

Figure 11:
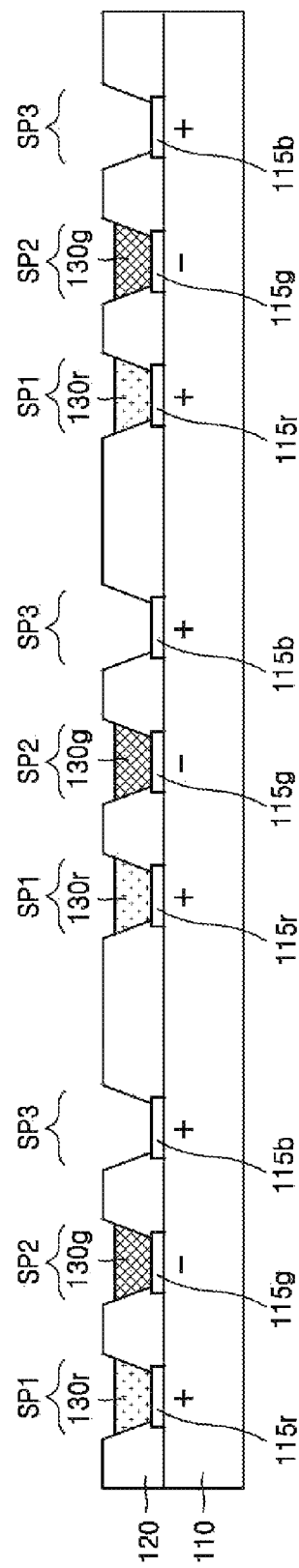
FIG. 11 is a schematic view showing the result of the deposition process of the second organic solution droplets shown in FIG. 10.

FIG. 11 is a schematic view showing the result of the deposition process of the second organic solution droplets 14b shown in FIG. 10.

Referring to FIG. 11, the second organic solution droplets 14b may be selectively deposited to the second sub-pixel region SP2 only. In such an embodiment, the second organic material layer 130g may be formed in the second sub-pixel region SP2. The second organic material layer 130g may include an organic material, which emits light of the second color. Therefore, when a predetermined voltage is applied to the second organic material layer 130g through the upper electrode 117 and the second lower electrode 115g shown in FIG. 2, the second organic material layer 130g may emit light of the second color.

Figure 12:
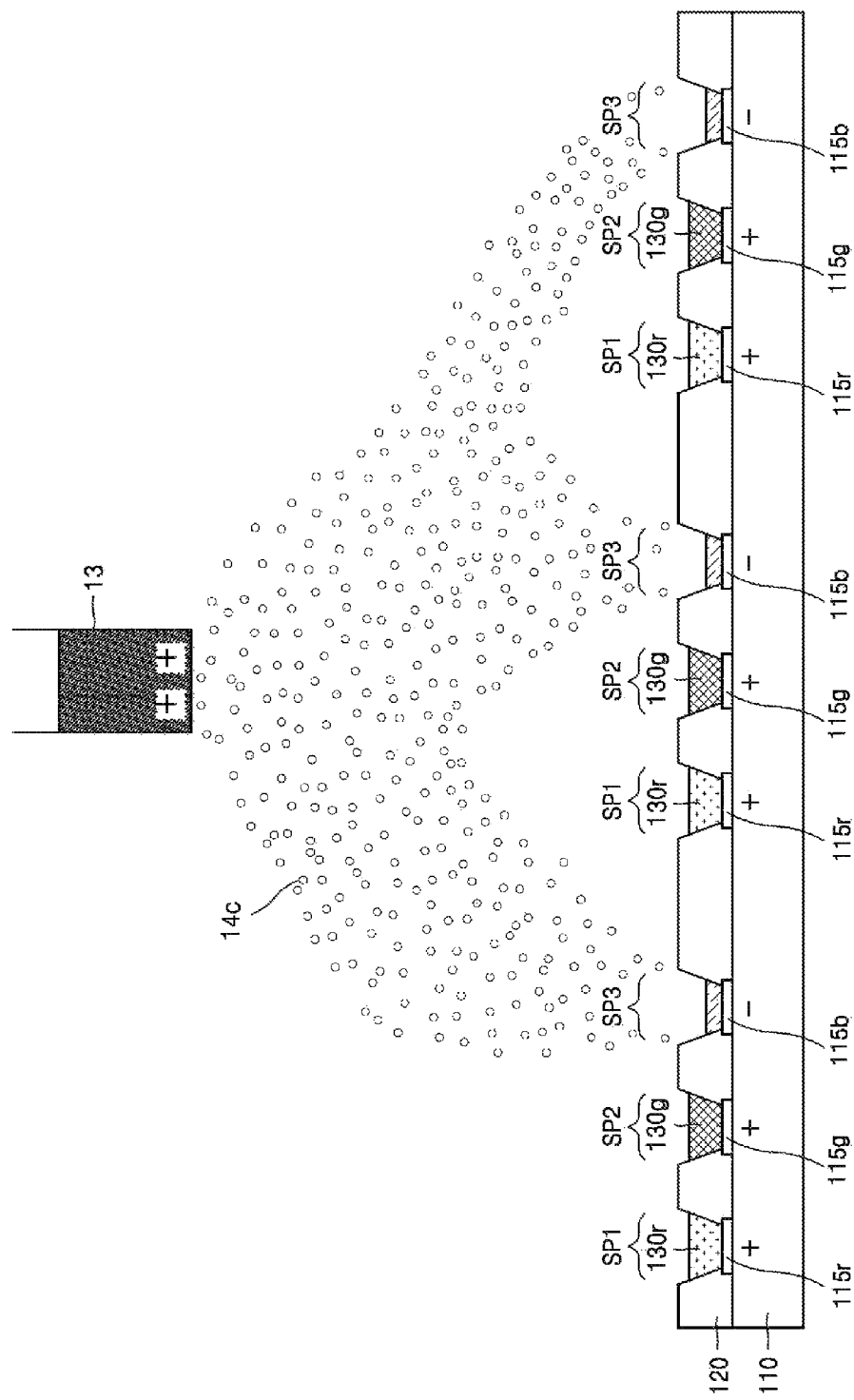
FIG. 12 is a schematic view that illustrate third organic solution droplets including a light-emitting material of a third color being selectively deposited to a third sub-pixel region.

FIG. 12 is a schematic view that describes third organic solution droplets 14c including a light-emitting material of the third color being selectively deposited to the third sub-pixel region SP3.

Referring to FIG. 12, the third organic solution droplets 14c sprayed from the nozzle 13 may be selectively deposited to the third sub-pixel region SP3. In such an embodiment, a voltage applied to the third sub-pixel SP3 and voltages applied to the first and second sub-pixels SP1 and SP2 may be set different from each other. In one embodiment, for example, as shown in FIG. 12, when the third organic solution droplets 14c are sprayed, a negative (−) voltage may be applied to the third sub-pixel region SP3. When the third organic solution droplets 14c are sprayed, positive (+) voltages may be applied to the first and second sub-pixel regions SP1 and SP2. When the negative (−) voltage is applied to the third sub-pixel region SP3, the third organic solution droplets 14c with a positive (+) charge may be selectively deposited to the third sub-pixel region SP3 by Coulombic electrostatic forces.

In an embodiment, as described above, the voltage applied to the third sub-pixel region SP3 and the voltages applied to the first and second sub-pixel regions SP1 and SP2 have opposite charges, but embodiments are not limited thereto. In one alternative embodiment, for example, the third sub-pixel region SP3 may be grounded to a ground voltage, and positive (+) voltages may be applied to the first and second sub-pixel regions SP1 and SP2. Alternatively, a negative (−) voltage may be applied to the third sub-pixel region SP3, and the first and second sub-pixel regions SP1 and SP2 may be grounded to a ground voltage. In some embodiments, negative (−) voltages may be applied to all of the sub-pixel regions SP1, SP2, SP3, and a voltage difference between the third sub-pixel region SP3 and the nozzle 13 may be set to be the greatest. In some embodiments, positive (+) voltages may be applied to all of the sub-pixel regions SP1, SP2, SP3, and a voltage difference between the third sub-pixel region SP3 and the nozzle 13 may be set to be the greatest by setting the voltage of the third sub-pixel region SP3 as the lowest. However, when the voltage of the third sub-pixel region SP3 is set higher than the voltage of the nozzle 13, deposition of the third organic solution droplets 14c may be difficult due to Coulombic repulsion forces. Thus, the voltage of the third sub-pixel region SP3 may be set lower than that of the nozzle 13. In an embodiment, as described above, the third sub-pixel region SP3 may have a voltage that is lower than those of the first and second sub-pixel regions SP1 and SP2. FIG. 12 illustrates the case when a positive (+) voltage is applied to the nozzle 13, but embodiments are not limited thereto. In one embodiment, for example, when a negative (−) voltage is applied to the nozzle 13, the highest voltage may be applied to the third sub-pixel region SP3. As described above, the voltages of the sub-pixel regions SP1, SP2, SP3 may be variously controlled to selectively deposit the third organic solution droplets 14c to the third sub-pixel region SP3.

Figure 13:
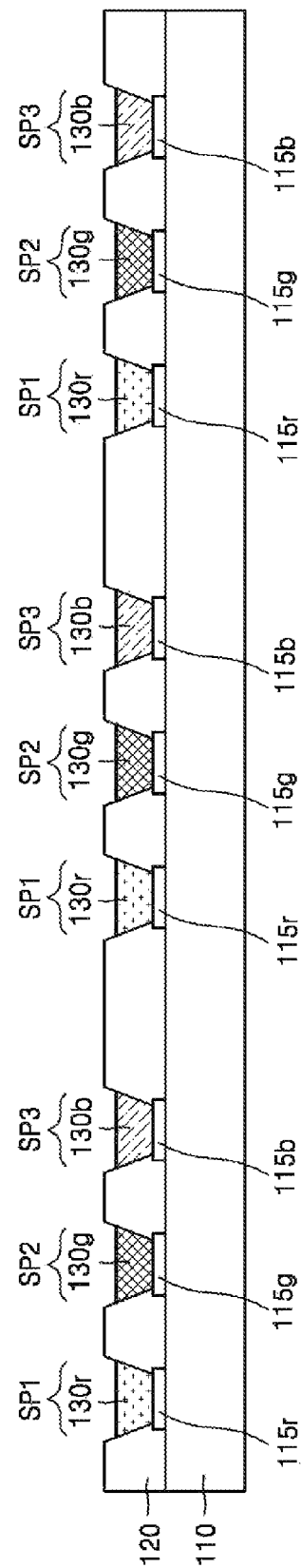
FIG. 13 is a schematic view showing the result of the deposition process of the third organic solution droplets shown in FIG. 12.

FIG. 13 is a schematic view showing the result of the deposition process of the third organic solution droplets 14c shown in FIG. 12.

Referring to FIG. 13, the third organic solution droplets 14c may be selectively deposited to the third sub-pixel region SP3 only. In such an embodiment, the third organic material layer 130b may be formed in the third sub-pixel region SP3. The third organic material layer 130b may include an organic material, which emits light of the third color. Therefore, when a predetermined voltage is applied to the third organic material layer 130b through the upper electrode 117 and the third lower electrode 115b shown in FIG. 2, the third organic material layer 130b may emit light of the third color.

According to embodiments of the invention, as described above with reference to FIGS. 5 to 13, a mask may not be used since the organic solution droplets are deposited by using voltage differences of the sub-pixel regions SP1, SP2, SP3. Thus, shadow effect, smudge, or spread of a light-emitting material that may occur when a mask is used may be effectively prevented. In such embodiments, a process of aligning masks is not used, and thus manufacture of a large-size panel may be easily performed, without using an expensive vacuum device. In an embodiment, when the organic solution 14 is deposited according to one or more embodiments, the organic solution 14 may be deposited on the first to third lower electrode 115r, 115g, 115b without the pixel definition layer 120. In such an embodiment, the sub-pixel regions SP1, SP2, SP3 may be defined by the first to third lower electrode 115r, 115g, 115b and regions where the organic solution 14 is deposited on the first to third lower electrode 115r, 115g, 115b.

In embodiments, as described above, the organic solution 14 sprayed from the nozzle 13 is sprayed to a wide area. According to another exemplary embodiment, the organic solution 14 sprayed from the nozzle 13 may be limited to a predetermined region, e.g., a fine region. When the organic solution 14 sprayed from the nozzle 13 is limited to a fine region, and a size of droplets of the organic solution 14 is reduced, the organic solution 14 may be deposited to the sub-pixel regions SP1, SP2, SP3 having a small size may be effectively and efficiently performed.

Figure 14:
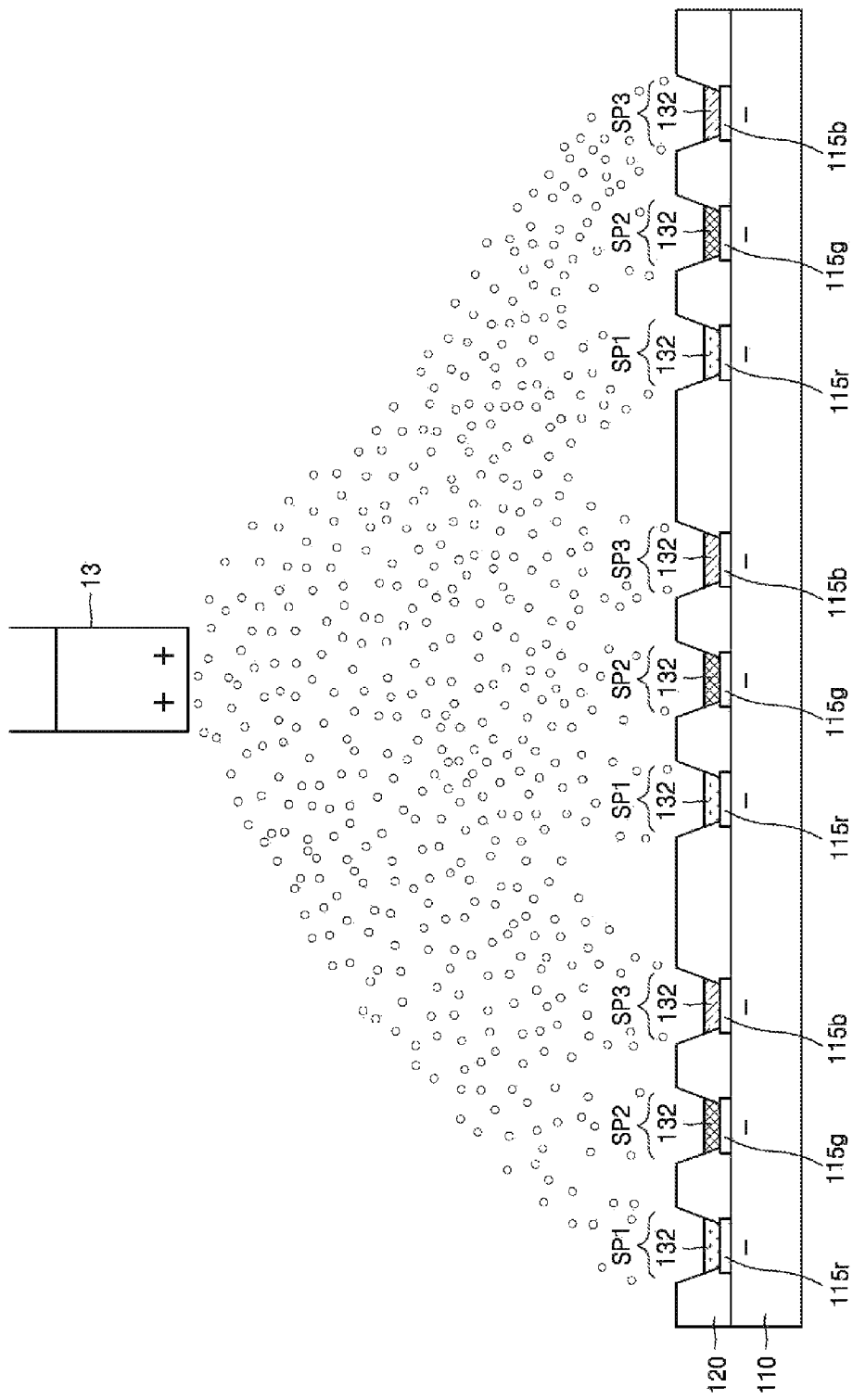
FIG. 14 is a schematic view that illustrate a deposition process of organic solution droplets when a size of the sub-pixel regions is small.

FIG. 14 is a schematic view that describes a deposition process of the organic solution droplets 14' when a size of the sub-pixel regions SP1, SP2, SP3 is small.

As shown in FIG. 14, when the size of the sub-pixel regions SP1, SP2, SP3 is reduced, the organic solution 14 sprayed from the nozzle 13 may overflow the sub-pixel region SP2. When a diameter of the nozzle 13 is in a range of about 9 μm to about 15 μm, a volume of the organic solution droplets 14' sprayed from the nozzle 13 may not be decreased lower than about 10 picoliter (μL) when no voltage is applied to the nozzle 13. Accordingly, a resolution of the first to third sub-pixels 111r, 111g, 111b may not be reduced to lower than about 150 pixels per inch (ppi) such that a resolution of the organic light-emitting device 100 may not be effectively increased.

Figure 15:
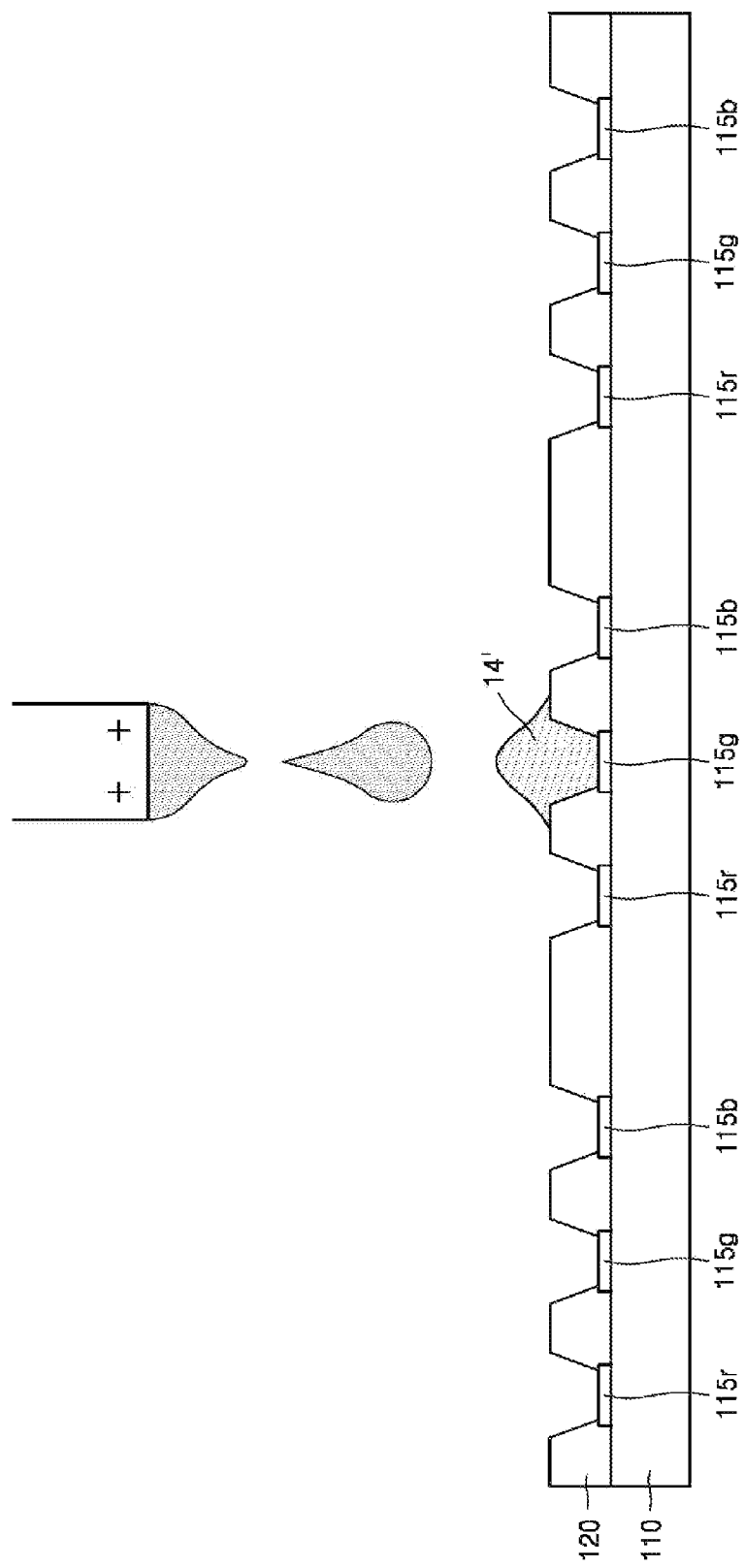

FIGS. 15 and 16 are schematic views illustrating an exemplary embodiment of the organic solution droplets 14' sprayed from the nozzle 13 having different size and shape by controlling a voltage of the nozzle 13.

Referring to FIG. 15, the organic solution 14 sprayed from the nozzle 13 may converge to a size having a diameter smaller than that of the nozzle and sprayed from the nozzle 13. In such an embodiment, a diameter of the nozzle 13 may be controlled to be in a range of about 50 μm to about 100 μm, and the voltage applied to the nozzle 13 may be controlled to be in a range of about 3 kV to about 5 kV. In such an embodiment, a voltage of a sub-pixel region SPt, on which the organic solution droplets are dropped, may be set to be lower than a voltage of another sub-pixel region SPr adjacent to the sub-pixel region SPt. In such an embodiment, the voltage of the nozzle 13 may be controlled in a way such that the organic solution 14 sprayed from the nozzle 13 has a cone-shape. In such an embodiment, as shown in FIG. 16, a volume of the organic solution droplet 14' sprayed from the nozzle 13 may be reduced. In such an embodiment, due to a voltage difference between the sub-pixel region SPt on which the organic solution droplet 14' is to be deposited and the nozzle 13, the organic solution droplet 14' may be dropped with high precision by being dropped substantially straightly from the nozzle 13. Therefore, the organic solution droplet 14' sprayed from the nozzle 13 may cover only a single sub-pixel region SPt.

FIGS. 15 and 16 illustrate embodiments where a negative (−) voltage is applied to the sub-pixel region SPt, to which the organic solution droplet 14' is deposited, and positive (+) voltages are applied to the other sub-pixel regions, but embodiments are not limited thereto. In one embodiment, for example, the sub-pixel region SPt, to which the organic solution droplet 14' is deposited, may be grounded to a ground voltage, and positive (+) voltages may be applied to the other sub-pixel regions. Alternatively, negative (−) voltages may be applied to all of the sub-pixel region SPt, to which the organic solution droplet 14' is deposited, and the other sub-pixel regions, while a voltage of the sub-pixel region SPt, to which the organic solution droplet 14' is deposited, may be the lowest. In such an embodiment, voltages of the other sub-pixel regions, where the organic solution droplet 14' is not deposited, may be different from each other. In one embodiment, for example, voltages applied to the sub-pixel region SPr adjacent to the sub-pixel region SPt, to which the organic solution droplet 14' is deposited, and the other sub-pixel regions may be different from each other.

When the organic solution droplet 14' is deposited in the same manner described with reference to FIGS. 15 and 16, the organic solution droplet 14' may be dropped with a small volume and with high precision. In such an embodiment, the organic solution droplet 14' may be easily deposited to the sub-pixel region SPt with a small size. Accordingly, a resolution of an organic light-emitting device manufactured by such an embodiment of the method may be increased to several hundreds ppi.

As described above, according to the embodiments described above with reference to FIGS. 1 to 15, voltages between a nozzle of an organic solution spray apparatus and sub-pixel regions may be controlled to form an organic material layer of a desired color in a predetermined sub-pixel region. In such embodiments, an organic solution from the nozzle of the organic solution spray apparatus may be sprayed to a plurality of sub-pixel regions having a large surface area at once, and thus a process time may be reduced. In such embodiments, a size of the organic solution droplet sprayed from the nozzle may be reduced by controlling a voltage of the nozzle, and thus may be effectively used to manufacture sub-pixels having small size, and thus, an organic light-emitting device having a high resolution may be effectively manufactured.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the invention have been described with reference to the figures, it will be understood by those of ordinary skill in the art that various changes in form and details may be made therein without departing from the spirit and scope of the invention as defined by the following claims.

What is claimed is:
1. A method of manufacturing an organic light-emitting device comprising a plurality of pixels using an organic solution spray apparatus, wherein each of the pixels comprises a plurality of sub-pixels having different colors from one another, the method comprising:
preparing a substrate on which a plurality of sub-pixel regions is defined;
generating a potential difference between a nozzle of the organic solution spray apparatus and at least one sub-pixel region among the plurality of sub-pixel regions;
spraying an organic solution from the nozzle of the organic solution spray apparatus to the sub-pixel regions; and
forming an organic material layer by selectively depositing the organic solution onto the at least one sub-pixel region among the plurality of sub-pixel regions;
the generating the potential difference between the nozzle of the organic solution spray apparatus and the at least one sub-pixel region among the plurality of sub-pixel regions comprises
applying a potential having a first polarity to a nozzle of the organic solution spray apparatus;
applying a potential having a second polarity opposite to the first polarity to the least one sub-pixel region among the plurality of sub-pixel regions;
applying a potential having the first polarity to at least one sub-pixel region remaining among the plurality of sub-pixel regions.

2. The method of claim 1, wherein each of the sub-pixel regions is defined by a lower electrode disposed on the substrate and connected to a thin film transistor.

3. The method of claim 1, wherein the generating the potential difference between the nozzle of the organic solution spray apparatus and the at least one sub-pixel region among the plurality of sub-pixel regions comprises applying a voltage to the sub-pixel regions through the thin film transistor.

4. The method of claim 2, further comprising:
forming an upper electrode on the organic material layer.

5. The method of claim 1, wherein the generating the potential difference between the nozzle of the organic solution spray apparatus and the at least one sub-pixel region among the plurality of sub-pixel regions comprises applying a positive (+) potential to the nozzle of the organic solution spray apparatus.

6. The method of claim 5, wherein the forming the organic material layer comprises selectively depositing the organic solution in the sub-pixel region having the lowest potential among the sub-pixel regions.

7. The method of claim 5, wherein the generating the potential difference between the nozzle of the organic solution spray apparatus and the at least one sub-pixel region among the plurality of sub-pixel regions further comprises applying an electric potential lower than an electric potential of the nozzle to the sub-pixel regions.

8. The method of claim 1, wherein the organic solution is dispersed and sprayed from the nozzle to cover an area having a diameter greater than a diameter of the nozzle.

9. The method of claim 8, wherein the organic solution is sprayed to cover at least two of the sub-pixel regions.

10. The method of claim 8, wherein
the diameter of the nozzle is in a range of about 50 μm to about 100 μm, and
a voltage applied to the nozzle is in a range of about 7 kV to about 10 kV.

11. The method of claim 1, wherein the organic solution is converged and sprayed from the nozzle to an area having a diameter less than a diameter of the nozzle.

12. The method of claim 11, wherein
a diameter of the nozzle is in a range of about 50 μm to about 100 μm, and a voltage applied to the nozzle is in a range of about 3 kV to about 5 kV.

13. The method of claim 11, wherein the organic solution is sprayed to cover the at least one sub-pixel region.

14. The method of claim 1, wherein the sub-pixel regions comprise first, second and third sub-pixel regions, which have different colors from one another.

15. The method of claim 14, wherein the first, second and third sub-pixel regions comprise red, green and blue sub-pixel regions.

16. The method of claim 14, wherein the first, second and third sub-pixel regions are defined by a first lower electrode connected to a first thin film transistor, a second lower electrode connected to a second thin film transistor, and a third lower electrode connected to a third thin film transistor, respectively.

17. The method of claim 14, further comprising:
forming a first organic material layer in the first sub-pixel region by spraying a first organic solution from the nozzle of the organic solution spray apparatus.

18. The method of claim 17, further comprising:
forming a second organic material layer in the second sub-pixel region by spraying a second solution from the nozzle of the organic solution spray apparatus; and
forming a third organic material layer in the third sub-pixel region by spraying a first organic solution from the nozzle of the organic solution spray apparatus.

19. The method of claim 1, further comprising:
forming an upper electrode on the organic material layer.

* * * * *